United States Patent [19]

Wei

[11] Patent Number: 5,292,624

[45] Date of Patent: Mar. 8, 1994

[54] METHOD FOR FORMING A METALLURGICAL INTERCONNECTION LAYER PACKAGE FOR A MULTILAYER CERAMIC SUBSTRATE

[75] Inventor: Shih-Long Wei, Hsinchu, Taiwan

[73] Assignee: International Technology Research Institute, Hsinchu, Taiwan

[21] Appl. No.: 944,348

[22] Filed: Sep. 14, 1992

[51] Int. Cl.⁵ .......................... G03F 7/00; H05K 3/02
[52] U.S. Cl. ..................... 430/313; 430/311; 430/314; 430/318; 430/329; 156/89; 156/625
[58] Field of Search ............... 430/198, 311, 313, 314, 430/318, 329; 156/89, 625, 659.1, 660; 428/209, 210, 320.2, 901

[56] References Cited

U.S. PATENT DOCUMENTS

| | | | |
|---|---|---|---|
| 4,373,019 | 2/1983 | Watanabe | 430/317 |
| 4,430,365 | 2/1984 | Schaible | 427/96 |
| 4,665,468 | 5/1987 | Dohya | 361/414 |
| 4,806,188 | 2/1989 | Rellick | 156/89 |

*Primary Examiner*—Marion E. McCamish
*Assistant Examiner*—Kathleen Duda
*Attorney, Agent, or Firm*—George O. Saile

[57] ABSTRACT

A multilayer interconnection system is formed on a multilayer ceramic (MLC), or glass ceramic body, by screening a blanket layer of etchable conductive paste on the body, drying and firing the resistant paste layer, and delineating the circuit pattern in the blanket layer with lithographic and etching techniques. A dielectric layer with via openings is formed over the circuit pattern, and the via openings filled. The steps are repeated until the desired circuitry is fabricated. A top circuit pattern is formed by screening an etchable conductive paste on the top surface, drying and firing the paste, and delineating the pattern using photolithographic and etching techniques.

11 Claims, 3 Drawing Sheets

METHOD FOR FORMING A METALLURGICAL INTERCONNECTION LAYER PACKAGE FOR A MULTILAYER CERAMIC SUBSTRATE

BACKGROUND OF THE INVENTION (1) Field of the Invention

This invention relates to multilayer metallurgy semiconductor packages, and more particularly to multilayer ceramic packages adapted to interconnect a plurality of large scale integrated circuit chips.

(2) Description of the Prior Art

The advent of large scale integrated circuit (LSI) semiconductor devices has produced a great increase in circuit density. To accommodate such high density LSI devices, the interconnection density of the packaging substrate must also increase. This means that the grid size which is the minimum via spacing must shrink. Grid size minima are a function of the particular material used as the interconnection support. The high performance LSI's require grid sizes about one-tenth that presently achievable by multilayer ceramic (MLC) technology. Dimensions on the interconnection substrate must approach those of the LSI chips.

An attempt has been made to apply the metallization technology in the manufacture of semiconductor devices, to the fabrication of packaging substrates, in particular to making connections between the relatively large metallurgy of the MLC substrate to the input-output (I/O) terminals of the device by providing additional top transistion layers on the MLC substrate. However, there are large differences between a packaging substrate and its function and that of the LSI chip. Because of longer signal lines on the packaging substrate, conductivity of the lines must be higher. They requires larger dimensions and as a consequence, a thicker dielectric and finally, a new layer to layer via technique.

Innumerable different thin film processing schemes for high-density interconnections have been developed, and others are still being explored to satisfy the demands of performance reliability, and cost.

Examples of packages that include an MLC or glass ceramic substrate provided with an interconnection layer system to establish electrical contact between the circuitry in the substrate and the device I/O's are shown in U.S. Pat. No. 4,430,365 and U.S. Pat. No. 4,665,468.

SUMMARY OF THE INVENTION

Accordingly, it is an object of the present invention to provide an improved method for forming a multilevel metallurgy on a packaging body for integrated circuit semiconductor devices.

It is another object of this invention to provide a method for forming multilevel interconnection metallurgy on a multilayer ceramic body.

It is a further object of the present invention to provide a method for forming an integral structure of an MLC substrate and an interconnection multilayer system that accommodates the interconnection of LSI chips on a MLC substrate.

In accordance with the present invention a multilayer system is fabricated on an MLC or glass ceramic body. A layer of etchable conductive paste is screened on the surface of the body, the resultant layer dried and fired, and a circuit pattern formed in the layer, using photolithographic and etching techniques. Thereafter, a dielectric layer with via holes is formed over the circuit pattern and the via holes filled, the steps repeated until the desired circuitry is formed. On the top surface the final metallurgy pattern is formed by screening an etchable conductive paste layer, drying and firing the layer, and forming the pattern using photolithographic and etching techniques. Resistors can be formed in the circuit pattern by screening an etchable resistive paste, drying and firing the paste, and defining the resistor elements using photolithographic and etching techniques.

DESCRIPTION OF THE PREFERRED EMBODIMENTS

Figure 1:
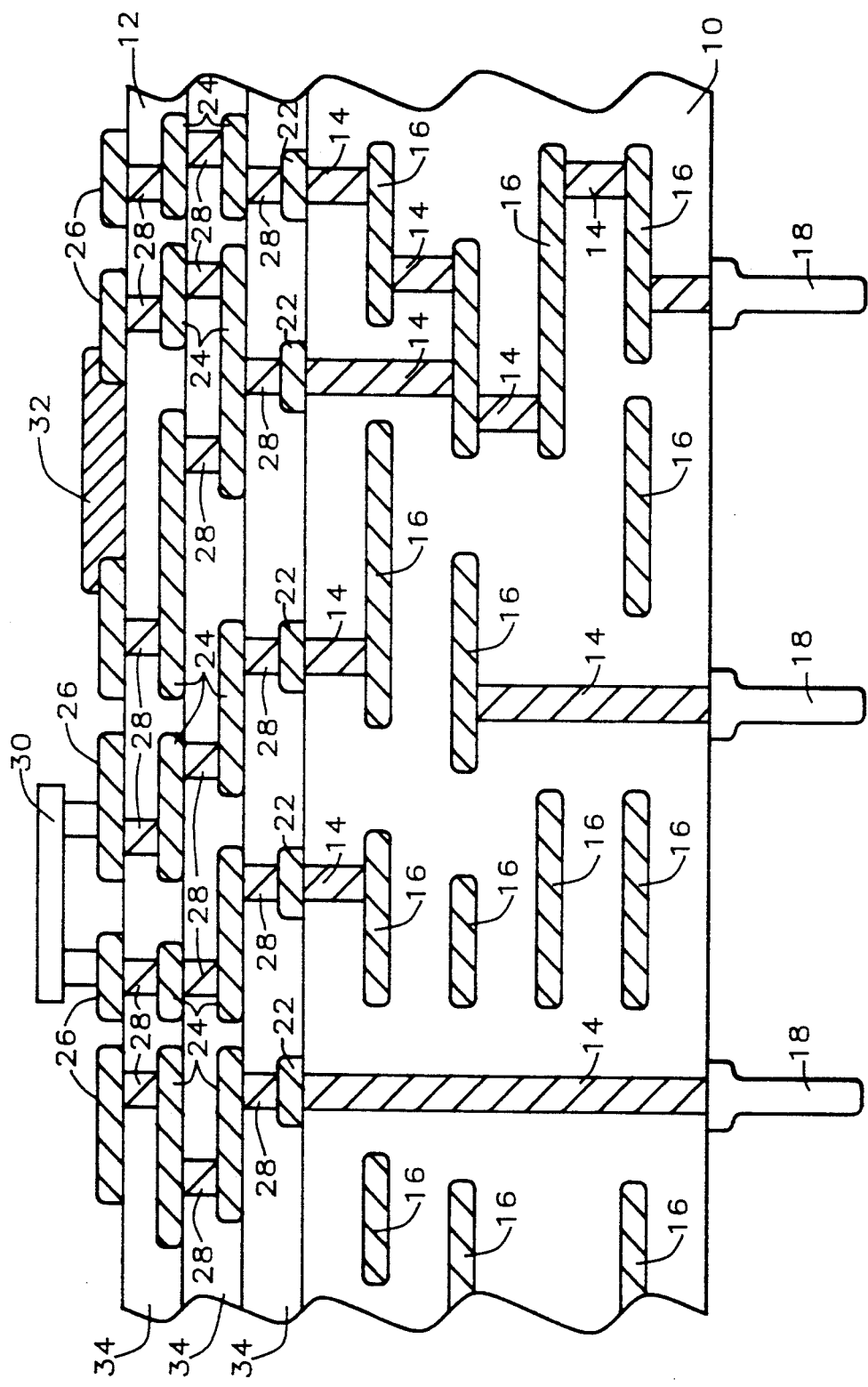
FIG. 1 is a cross sectional view, in broken section and in greatly enlarged scale, of a multilevel interconnection package manufactured in accordance with the present invention.

The present invention will be described in detail with reference to the accompanying drawings. FIG. 1 illustrates a cross sectional of a multilevel interconnectional packaging structure for mounting large scale integrated circuit semiconductor device chips. The package includes a multilayer ceramic body 10, and a multilevel interconnection layer 12 formed on the top surface of body 10. The interconnection structures in 10 and 12 are electrically joined to input/output (I/O) pins 18. The multilevel ceramic body 10 includes multiple layers of conductive patterns 16, sandwiched between ceramic layers that are connected by vias 14 as required by the circuit design. Body 10 is well known in the art.

The interconnection layer 12 is formed to provide a smaller grid size of a denser interconnection on the surface portion of the body 12. It includes lower level 22 of a conductive metallurgy pattern joined to body 10, intermediate levels 24 of metallurgy, and a top level 26 of metallurgy. The various levels of metallurgy are electrically connected by vias 28. Each of the intermediate and top metallurgy levels are supported o na fired dielectric layer 34. On the top level chips 30 can be joined to the metallurgy 26 by solder bonding or other techniques. Also resistors 32 can be provided. The general concept of a MLC substrate provided with an upper multilevel layer system, having a smaller grid size is known in the art. This invention is directed to an improved method of fabricating the upper multilevel layer system.

FIGS. 2 through 6 is a sequence of step-by-step cross sectional views illustrating preferred method embodiments for fabricating the upper multilevel system supported of the ceramic body 10.

Figure 2:
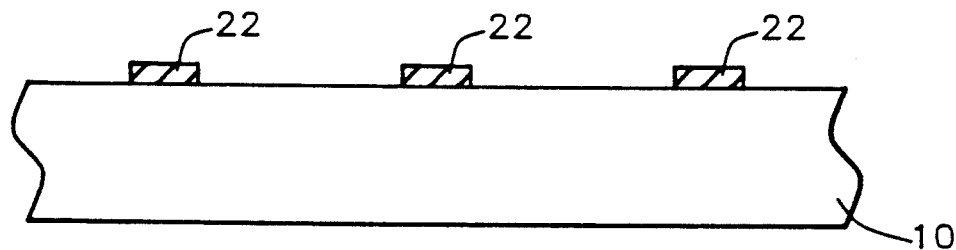
FIGS. 2 through 6 is a sequence of cross sectional views of a substrate that illustrates its structures at various stages of the method of the invention.

A ceramic body 10, described previously, having conductive vias (not shown) provides the starting point for the method of the invention. Body 10 can be an MLC or glass ceramic substrate, or conceivably a monolithic ceramic substrate having pins that extend through the substrate, or other connections on the surface joined to pins or other type connections on the other side. The surface of body 10 can be lapped to improve flatness if necessary or desirable. As indicated in FIG. 2, the first metallurgy pattern 22 is provided by screening a blanket layer of etchable conductive metal paste on the ceramic body 10 that contacts the vias (not shown) in the body. The conductive paste can include any suitable inert metal of high conductivity as a conductive agent, i.e. as a conductively imparting powder, such as gold, silver, platinum, palladium, copper, or combinations thereof. The preferred conductive paste includes gold.

In general, the thick film paste may be composed of gold, copper, silver or other highly conductivity powders; glass frit and/or metal oxides; and suitable nonvolatile materials of the thick film conductor paste consist of three main phases, (1) a conductive phase, (2) a permanent binder phase and (3) an organic vehicle. The conductive phase consist of finely divided precious metal powders. The metal powders used in the conductors are usually prepared by precipitation from aqueous solution. Permanent binder phase of thick film conductor paste determines the adhesion of the conductor to the substrate and also has a significant effect of other conductor properties. These permanent binder materials may be glass, metal oxide or a mixture of glass and metal oxides. Glasses, such as those with lead-bismuth-silicate or lead borosilicate chemistry wet the substrate, creating a mechanical bond to the substrate during firing. Oxides, such $Cu_2O$ of $PdO$ often are added to form chemical or reactive bonds with the substrate. The vehicle typically contains two components, a volatile solvent and a nonvolatile organic resin. The vehicle is necessary for screen printing. Dispersing agents and rheological additives may be added in small quantities to adjust viscosity, printability and shelf life. A preferred conductive paste is sold by Johnson-Matthey Electronics, 10080 Willow Creek Road, San Diego, Calif., and sold under the trade name J M 1202. This paste is an ultra fine line etchable gold conductor paste.

The thickness of the etchable screened-on paste is typically in the range of about 3.0 to 5.0 microns. The blanket layer of paste is then dried, typically for 10 to 15 minutes at 150° C. in a convection oven, or 3 to 7 minutes in an infra-red dryer. The dried layer is then fired, typically with peak firing temperature of 850° C. and at a dual time at peak of about 10 minutes. The fired thickness of the paste layer will typically be in the range of 2.5 to 3.5 microns. A layer of photoresist is deposited on the blanket layer of paste, and the layer exposed to define pattern 22. The photoresist is then developed to leave portions over the desired pattern, and the exposed areas of paste etched away with a suitable etchant. A typical etchant useful for etching the aforedescribed gold paste consists of:

water ($H_2O$): 2000 cm$^3$
Potassium Iodine (KI): 250 grm.
Iodine ($I_3$): 60 grm.

The etching time for a fired thickness of 2.5 to 3.5 microns is about 10 to 15 minutes at a temperature of 28° to 30° C.

Figure 3:
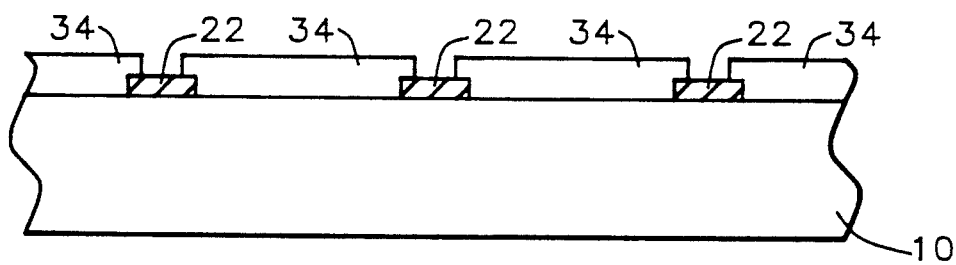

As shown in FIG. 3, a dielectric layer 34, provided with vias 36, is formed over pattern 22. A first preferred technique for forming layer 34 is to screen a blanket layer of an etchable and firable dielectric material over pattern 22. The thickness of the screened layer of dielectric material is typically in the range of about 15 to 45 microns. Typically the dielectric material will include a ceramic powder, a glass powder, a vehicle and a plasticizer. A preferred dielectric paste for use in the method of the invention is sold by Johnson Matthey Electronics under the trade name LS 653. This material should be dried at room temperature for 10 to 15 minutes, followed by heating at 120° C. for 10 to 15 minutes. It should be fired for 8 to 12 minutes at a peak temperature of 850° C. with a 55 minute in/out cycle.

The thickness of the fired layer will shrink approximately 20% from the screened thickness. Via openings 36 are formed in the layer 34 using conventional thick film screen printing techniques.

Figure 4:
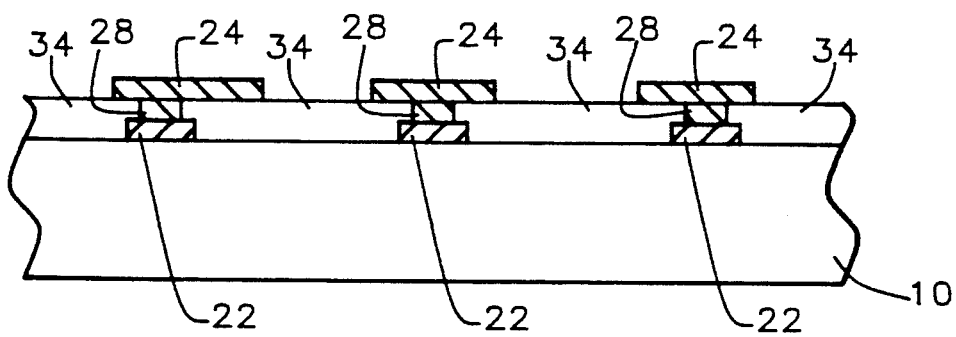
Figure 5:
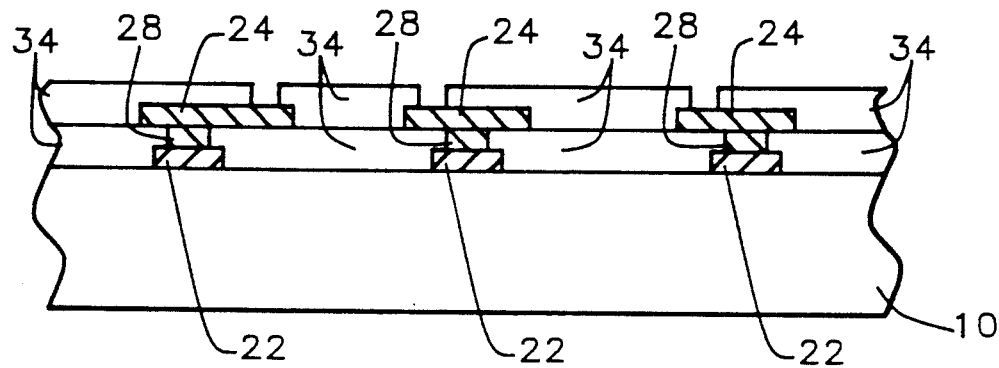

As indicated in FIG. 4, the via openings 36 are filled with a suitable conductive metal paste, forming vias 28, preferably with the same paste used to form pattern 22. The vias are preferably filled by squeezing the paste in the via openings. The paste is then dried and fired as previously described with pattern 22. An intermediate metallurgy pattern 24 is formed over layer 34 by repeating the process steps used to form pattern 22. The overlying dielectric layer 34 is formed in the same manner as lower dielectric layer 34.

Figure 6:
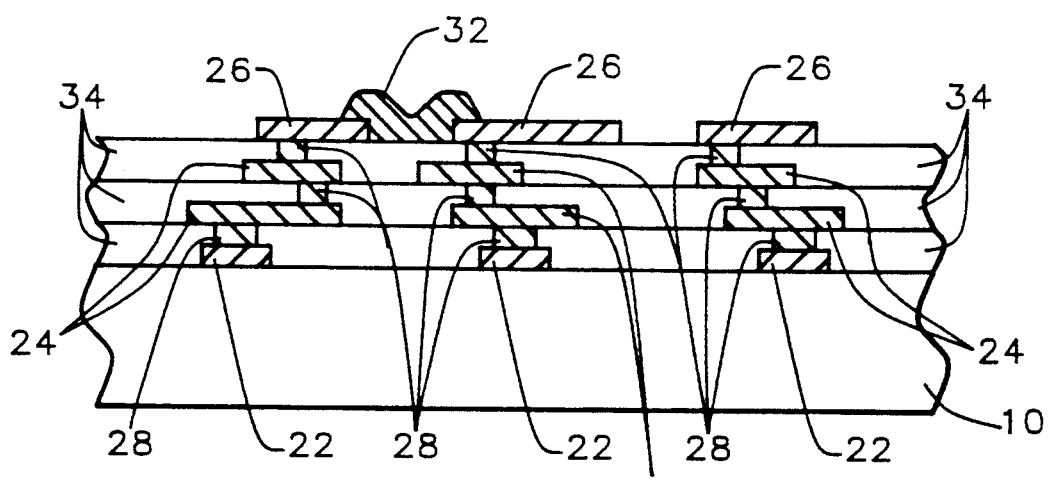

As shown in FIG. 6, a top metallurgy layer 26 is formed o the top surface of the top dielectric layer after the desired number of layers have been built up by repeating the steps described for forming the metallurgy patterns, the dielectric layer and vias. Metallurgy layer 26 is formed in the same general manner as the underlying layers 22 and 24, i.e., by photolithographic and etching techniques. If necessary or desirable, a resistor 32 can be formed by screening a resistor paste and forming it by photolithographic and etching techniques. Layer 34, as shown in FIG. 3, can be formed by laminating a layer of transfer tape, formed of dielectric material, over the surface of body 10 and covering metallurgy pattern 22 after via holes have been punched in the tape. The via hole can be formed by YAG and $CO_2$ lasers, hard tool sequential punching and conventional PCB drilling equipment. The tape will typically include a combination of inorganic dielectric powder dispersed in an organic material. The organic matrix phase consists of a combination of thermoplastic resin, plasticizers, and dispersent oils selected to provide optimum processability and reproducible properties in fired tape laminates. The lamination process consists of registering the substrate in a laminating fixture, placing the prepared sheet of tape over the substrate, registering it using prepunched registration holes in the outer boundary that correspond with the three-point registration for the substrate, and applying uniform pressure of 500 to 1500 PSI to the tape for 5 to 10 minutes with temperatures of 50° to 60° C.

In order to achieve the optimum electrical properties, the organic vehicle must be burned out prior to densification of the dielectric tape, the tape is dried or burned at a temperature in the range of 300° to 350° C. for a time in the range of 30 to 60 minutes.

The tape is fired after it is laminated and dried, typically at a temperature of about 850° C. for a time in the range of 10 to 15 minutes. A tape useful for use in the method of the invention is sold by EMCA-REMEX Products, 160 Commerce Drive, Montgomeryville, Pa. 18936, USA, under the trade name EMCA-REMEX D1-TRAN (Reg. Trade Mark). The thickness of the tape will typically be in the range of 75 to 100 microns before firing, and from 60 to 75 microns after firing.

The remaining steps of the second embodiment are the same as described in the first embodiment.

The advantages of this process over the known techniques for forming the upper multi-level system on a ceramic substrate are (1) the cost of this thick film process is 30 to 50% the cost for the thin film process; (2) this process has no vacuum requirement, such as sputtering or evaporation techniques in forming metal films; (3) this process needs no plating, which is a possible source of contamination to increase the thickness of the conductive layers; (4) this process can lower the electrical resistivity; (5) this process needs no expensive equipment, the investment for equipment is about 10 to 20% for the thin film process.

While the invention has been particularly shown and described with reference to the preferred embodiments thereof, it will be understood by those skilled in the art, that various changes in form and details may be made without departing from the spirit and scope of the invention.

What is claimed is:

1. A method of fabricating on a multilayer ceramic body, a metallurgical interconnection layer system for interconnection of a plurality of large scale integrated circuit semiconductor chips, said ceramic body including conductive circuitry and vias therein, the vias extending from said conductive circuitry and forming a planar surface with said ceramic body, said method comprising:

screen printing, drying and firing a blanket layer of etchable conductive metal paste on said ceramic body;

depositing a layer of photoresist over said metal paste;

exposing and developing said photoresist to form a fine line circuit pattern including exposed areas between the fine line pattern;

etching the exposed areas of the fired layer of metal paste to form a circuit pattern, and removing the developed photoresist layer;

screen printing, drying and firing a layer of dielectric material over said circuit pattern, said layer of dielectric material having via holes;

filling the via holes with a conductive paste, and drying and firing said conductive paste;

repeating the aforesaid process steps to build up the necessary levels of the interconnection pattern;

screen printing, drying and firing a top layer of etchable conductive paste;

said metal paste including conductivity imparting powders, glass frit, and a vehicle which includes a nonvolatile resin and volatile solvent, depositing a layer of photoresist on the surface of said conductive paste, exposing said photoresist to form a fine line top circuit pattern, and developing the photoresist; and etching the exposed areas of the layer of etchable conductive paste, and removing the remaining photoresist.

2. The method of claim 1, wherein resistor elements are formed with said fine line top circuit pattern by screen printing a blanket layer of resistor paste over said pattern, drying and firing said and, defining the resistor elements using photolithographic and etching techniques.

3. The method of claim 1, wherein said etchable conductive paste includes gold powder as the conductive element.

4. The method of claim 3, wherein the thickness of said etchable metal paste layer is equal to or less than about 5 microns, prior to drying and firing.

5. The method of claim 4, wherein the thickness of the layer of dried and fired etchable metal paste is in the range 2.5 to 3.5 microns.

6. The method of claim 3, wherein said etchable conductive paste is dried at room temperature for a time in the range of 10 to 15 minutes, and subsequently fired at a temperature of approximately 850° C.

7. The method of claim 6, wherein the firing of said etchable conductive paste is done at a temperature in the range of about 800° to 900° C. for a time of approximately 10 minutes.

8. The method of claim 1, wherein said dielectric paste is comprised of ceramic powder, glass powder, vehicle and plasticizer.

9. The method of claim 1, wherein the thickness of said etchable dielectric paste layer before drying and tiring is equal to or less than about 45 microns.

10. The method of claim 1, wherein said dielectric paste is dried at a temperature in the range of 115° to 125° C. for a time in the range of 10 to 15 minutes.

11. The method of claim 10, wherein said dielectric paste is fired at a peak temperature of 850° C. for a time in the range of 8 to 12 minutes.

* * * * *